(12) United States Patent
Moelker et al.

(10) Patent No.: US 7,840,884 B2
(45) Date of Patent: Nov. 23, 2010

(54) TURBO DECODING WITH ITERATIVE ESTIMATION OF CHANNEL PARAMETERS

(75) Inventors: Dignus-Jan Moelker, Voorhout (NL); Jan Stemerdink, Winterswijk (NL)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 866 days.

(21) Appl. No.: 10/596,776

(22) PCT Filed: Dec. 23, 2003

(86) PCT No.: PCT/NL03/00924

§ 371 (c)(1), (2), (4) Date: May 10, 2007

(87) PCT Pub. No.: WO2005/062473

PCT Pub. Date: Jul. 7, 2005

(65) Prior Publication Data

US 2007/0286292 A1    Dec. 13, 2007

(51) Int. Cl.
    *H03M 13/00*    (2006.01)
(52) U.S. Cl. .................. 714/786; 714/774
(58) Field of Classification Search ............ 714/774, 714/786
    See application file for complete search history.

(56) References Cited

U.S. PATENT DOCUMENTS

| | | | | |
|---|---|---|---|---|
| 5,113,400 A * | 5/1992 | Gould et al. | ............... | 714/795 |
| 5,233,629 A * | 8/1993 | Paik et al. | ............... | 375/262 |
| 5,414,738 A * | 5/1995 | Bienz | ............... | 375/341 |
| 6,012,161 A * | 1/2000 | Ariyavisitakul et al. | ....... | 714/795 |
| 6,202,189 B1 * | 3/2001 | Hinedi et al. | ............... | 714/786 |
| 6,347,391 B1 * | 2/2002 | Uesugi et al. | ............... | 714/795 |
| 6,526,539 B1 | 2/2003 | Kawabata et al. | | |
| 6,574,291 B2 | 6/2003 | Doetsch et al. | | |
| 6,671,852 B1 * | 12/2003 | Ariel et al. | ............... | 714/793 |
| 6,748,032 B1 * | 6/2004 | Kim et al. | ............... | 375/340 |
| 6,775,800 B2 * | 8/2004 | Edmonston et al. | ......... | 714/755 |
| 6,982,659 B2 * | 1/2006 | Shen et al. | ............... | 341/50 |
| 7,231,577 B2 * | 6/2007 | Richardson et al. | ......... | 714/758 |
| 2004/0022336 A1 * | 2/2004 | Yu et al. | ............... | 375/346 |
| 2004/0168114 A1 * | 8/2004 | Richardson et al. | ......... | 714/758 |

FOREIGN PATENT DOCUMENTS

GB    2 360 425 A    9/2001

OTHER PUBLICATIONS

Valenti M C et al: "Iterative channel estimation and decoding of pilot symbol assisted turbo codes over flat-fading channels" IEEE Journal on Selected Areas in Communications, Sep. 2001, IEEE USA, vol. 19, No. 9, pp. 1697-1705, XP002285321 ISSN: 0733-8716, p. 1698-p. 1700; figures 2, 3.

Kim Jung-Woo et al: "Turbo code with iterative channel estimator using soft-output of turbo decoder" Electronics Letters, IEE Stevenage, GB, vol. 36, No. 18 Aug. 31, 2000, pp. 1560-1562. XP006015636 ISSN: 0013-5194 the whole document.

* cited by examiner

*Primary Examiner*—M. Mujtaba K Chaudry

(57) ABSTRACT

Method and decoding device for decoding a convolutionally coded input data signal y. The input data signal is multiplied with a scaling factor $L_c$ (8) and then demultiplexed (6). The demultiplexed input data signal $L_cS$ is then turbo decoded (5) in order to obtain decoder output likelihood ratio data $\Lambda$. The scaling factor $L_c$ is updated (7) for a next iteration in dependence on a combination of a posteriori likelihood data based on turbo decoded output data $\Lambda$ and a priori likelihood data based on the demultiplexed signal $L_cS$.

8 Claims, 1 Drawing Sheet

TURBO DECODING WITH ITERATIVE ESTIMATION OF CHANNEL PARAMETERS

BACKGROUND OF THE INVENTION

The present invention relates to a method for decoding a convolutionally coded input data signal y comprising multiplying the input data signal with a scaling factor $L_c$, demultiplexing the multiplied input data signal $L_c y$ into three signals which are related to systematic bits and parity bits, a demultiplexed input data signal $L_c S$ being associated with the systematic bits, e.g. in parity signals and a systematic signal and turbo decoding the demultiplexed input data signal $L_c S$ in order to obtain turbo decoded output $\Lambda$. In a further aspect, the present invention relates to a decoder device for decoding a convolutionally coded input data signal y comprising a multiplication element for multiplying a received input data signal y with a scaling factor L, a demultiplexer for demultiplexing the multiplied input data signal ly, e.g. in parity signals and a systematic signal, and a turbo decoder for decoding the demultiplexed input data signal IS in order to obtain decoder output likelihood ratio data.

PRIOR ART AND PROBLEMS

Such a method of decoding data and a decoder device are known from American patent US-B-6,574,291, which discloses a turbo-code decoder with iterative channel parameter estimation.

American patent publication US-B-6,393,076 describes a method for decoding turbo codes using data scaling. Convolutionally coded input data is decoded in a near ideal manner. A portion of the input data is buffered, after which a mean of the data in the portion of the input data is calculated. Then a root-mean-square value of the portion is calculated using the mean. A scaling factor is derived from the root-mean square value, which scaling factor is used to scale the portion of the input data before the turbo decoding step.

These disclosed methods have the disadvantage that the scaling factor computation is not based on a-posteriori likelihood information, which leads to additional loss. Especially in mobile applications using these kind of coding, every additional loss has a negative effect on system performance.

The publication of El-Gamal, H., High capacity Synchronous FH/SSMA networks with turbo coding, IEEE Intern. Symp. on Spread Spectrum Techniques, 1998, p 973-977, provides a similar method for scaling the input data. The method consists of computing the noise variation, which is subsequently applied to form log-likelihood values. This method has the disadvantage that it assumes the signal amplitude as normalized to unity. This is a simplification not valid for practical receiving equipment, and therefore negatively impacts the system performance.

The article by M.S. Valenti et al. 'Iterative channel estimation and decoding of pilot symbol assisted turbo codes over flat-fading channels', IEEE Journal on selected areas in communications, September 2001, IEEE, USA, vol. 10, no. 9 pages 1697-1705 discloses a method for coherently detecting and decoding turbo-coded binary shift keying signals transmitted over frequency flat fading channels. The use of hard-decision feedback and soft-decision feedback are considered.

The British patent application GB-A-2 360 425 discloses a channel state information estimation for turbo-code decoders. In this document, only the use of a maximum a posteriori (MAP) probability decoding algorithm is disclosed.

SUMMARY OF THE INVENTION

The present invention seeks to provide an improved decoding scheme for use in transceivers using a maximum-a-posteriori (MAP) decoder, or related techniques such as Logarithmic MAP (LOGMAP).

According to the present invention, a method is provided, in which the scaling factor L is updated for a next iteration in dependence on a combination of a posteriori likelihood data based on turbo decoded output data A and a priori likelihood data based on the demultiplexed signal LS. By combining these a posteriori and a priori likelihood data, it is possible to improve the performance of the decoding method without the need of much additional hardware or software resources.

In an embodiment of the present invention the scaling factor is updated using an estimate of the mean value of the signal amplitude $\hat{c}$ and an estimate of the noise variation $\hat{\sigma}_{n'}^2$. The update of the scaling factor can e.g. be calculated according to $$\hat{L}_c = \frac{2}{\hat{c} \cdot \hat{\sigma}_{n'}^2} \cdot L_c,$$

in which $\hat{L}_c$ is the updated scaling factor. The estimate of the mean value of the signal amplitude may be equal to $$\hat{c} = \frac{1}{N} \sum_{i=0}^{N-1} \mathrm{sgn}(\Lambda_i) \cdot L_c \cdot s_i,$$

where N is the number of bits in a coding block of the input data signal, $s_i$ is the $i^{th}$ systematic bit, $\hat{c}$ is the estimation of the amplitude of the scaled systematic bits $L_c \cdot s_i$ and $\Lambda_i$ is the log-likelihood ratio resulting from the most recent turbo decoder iteration.

In a further embodiment, the noise variance estimation $\hat{\sigma}_{n'}^2$, may equal $$\hat{\sigma}_{n'}^2 = \frac{1}{N-1} \sum_{i=0}^{N-1} (s_i' - 1)^2 \cdot P_i(1) + (s_i' + 1)^2 \cdot P_i(0) - K;$$

the probability of the $i^{th}$ bit being zero is estimated like $$Pr\{x_i = 0\} = P_i(0) = \frac{1}{1 + e^{-\Lambda_i}}$$

and the probability of that bit being one like $$Pr\{x_i = 1\} = P_i(1) = \frac{1}{1 + e^{\Lambda_i}} = 1 - P_i(0);$$

the normalised systematic bits $s'_i$ are calculated as $$s_i' = \frac{L_c \cdot s_i}{\hat{c}};$$

and where K is a bias correction computed as $$K = \frac{1}{N} \sum_{i=0}^{N-1} 2 \cdot (P_i(0) - P_i(1)) \cdot s'_i - 2.$$

This makes the present method accurate and fast, so that it secures the advantage (simulations show the loss compared to the theoretical optimum is about 0.03 dB), and is applicable in fast fading or time-variant channels. It has been shown that about 0.1 to 0.2 dB in sensitivity improvement for turbo codes can be achieved, compared to prior art methods.

In a further embodiment, the scaling factor $L_c$ is initialized either as a fixed value, as the result of an initial number of iterations using a known algorithm, as the result of filtering over subsequent iterations and coding blocks, or as the result of SNR/SIR estimation of the input data signal. Initialization can thus be accomplished using very simple solutions or more complex but well known solutions.

In an even further embodiment of the present invention, the method further comprises calculating the variation of the scaling factor in subsequent iterations and, when the variation after a predetermined number of iterations is above a predetermined threshold value, reverting to a different scaling factor calculation method and/or turbo decoding method. The different scaling factor calculation method may e.g. be a fixed scaling factor, a Log-MAX method or a SOVA method (Soft Output Viterbi Algorithm). In this manner, a simple divergence monitoring of the iterative method can be accomplished, using known algorithms as back-up.

In a further aspect of the present invention, a decoder device is provided according to the preamble defined above, in which the decoder device further comprises an adaptive scaling element which is arranged to update the scaling factor $L_c$ for a next iteration based on a combination of a posteriori likelihood data based on turbo decoded output data and a priori likelihood data based on the demultiplexed signal.

The adaptive scaling element may be further arranged to execute the present method. Accordingly, the present decoder device provides an improved performance over prior art devices. Because the sensitivity improvement only requires a small hardware cost, the sensitivity improvement is a pure bonus. The important system aspects, which influence sensitivity, are signal strength, i.e. range/coverage/battery life, noise figure, and interference, i.e., air interface capacity. Hence, the advantage of the present invention can be translated into a coverage increase (<1% more range), increased mobile battery life time (2 to 4% less transmit power), relaxed noise figure requirements (0.2 dB less), or improved capacity users on the air interface (2 to 4% more). This yields a larger cell-coverage and lower power usage for the mobile, which in turn gives less interference, and therefore more capacity.

In an even further aspect, the present invention provides a computer program product, which comprises computer executable code, which when loaded on a processing system, provides the processing system with the capability to execute the present method. The processing system may comprise a microprocessor and peripheral equipment, a digital signal processor or a combination of both to execute the present method.

BRIEF DESCRIPTION OF DRAWINGS

The present invention will be discussed in more detail below, using a number of exemplary embodiments, with reference to the attached drawings, in which.

DETAILED DESCRIPTION OF THE INVENTION

Figure 1:
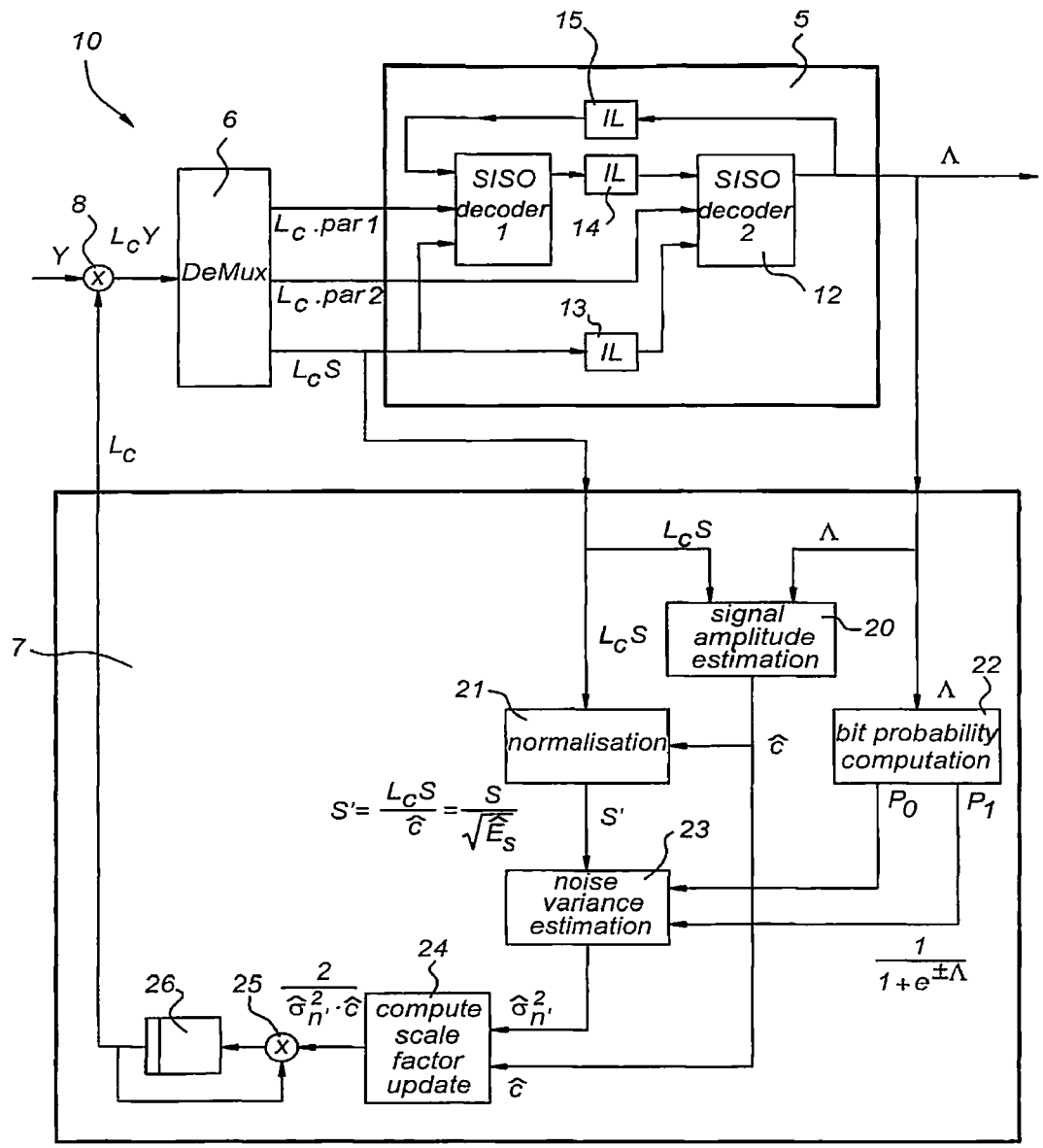
FIG. 1 shows a block diagram of an embodiment of the decoding scheme according to the present invention.

The present application may be advantageously applied in decoding of systematic forward error-correcting codes, such as the parallel concatenated convolutional turbo codes found in third generation mobile telecommunication systems (3GPP). The present invention can be employed in transceivers using a maximum-a-posteriori (MAP) decoder, or related techniques, such as Log-MAP.

Iterative MAP and Log-MAP decoding are asympotically optimum. Sub-optimal decoding algorithms, such as soft output Viterbi algorithm (SOVA) or approximated LOGMAP (Log-Max), are simpler implementation-wise, yet about 0.5 dB short of the MAP and Log-MAP performance.

The problem with achieving the full extent of MAP performance is the requirement that the input data is defined as a (log) likelihood ratio. With the present invention it is possible to scale the decoder input data in a time-variant, fading channel, quickly and accurately, in order to form (log)likelihood values.

The present method uses the a-posteriori likelihood data to form probability information of the decoded bits. This is combined with the decoder a-priori likelihood data, in order to optimally determine the desired signal mean and noise variance. These are used to iteratively scale the a-priori information.

The scaling factor should be initialized. The invention foresees in several different methods for this:

Use the scaling factor from the previous coding block (filtered or not);

Run the first iteration(s) with SOVA or Log-Max;

Deploy any method as initial value setting; or

Any combination of these.

FIG. 1 shows a block diagram of the iterative scaling algorithm 10 for decoding convolutionally coded data. The received symbols y are multiplied by a scaling factor $L_c$ using a multiplier 8 before they are de-multiplexed using a demultiplexer 6 into systematic bits $s_i$ and parity bits $par_1$, $par_2$ that are input to a turbo decoder 5. After an iteration of the decoder 5 an adaptive scaler 7 makes an estimation of the signal amplitude and the noise variance, based on the decoder output log-likelihood ratios $\Lambda_i$. From these estimations a new scaling factor $L_c$ is computed for the next iteration.

The turbo decoder 5 comprises as shown in FIG. 1, interleavers 13, 14, de-interleaver 15, and decoders 11, 12. More in detail, the turbo decoder 5 comprises first and second soft input soft output (SISO) decoder sections 11, 12 which receive data from the demultiplexer 6. The functioning of the turbo decoder 5 is known to the person skilled in the art (see e.g. U.S. Pat. No. 6,393,076) and needs no further explanation in this description.

In the following the operation of the adaptive scaler 7 is explained in detail. The calculations performed by the adaptive scaler 7 are described as algorithms, calculations and the like.

For the person skilled in the art, it will be clear that the algorithms and calculations as performed by the various blocks and elements of the decoder algorithm 10 may be implemented using software, hardware resources or a combination of both, such as analogue electronics, logical circuitry, signal processors, etc.

The signal amplitude is computed in block 20 from the log-likelihood ratios $\Lambda_i$ resulting from the most recent turbo decoder 5 iteration, and from the systematic bits as follows:

$$\hat{c} = \frac{1}{N} \sum_{i=0}^{N-1} \text{sgn}(\Lambda_i) \cdot L_c \cdot s_i$$

where N is the number of bits in a coding block and $s_i$ is the $i^{th}$ systematic bit. $\hat{c}$ is the estimation of the amplitude of the scaled systematic bits $L_c \cdot s_i$; if $\hat{E}_s$ is the estimated symbol energy of the signal component of input sequence $s_i$, then $\sqrt{\hat{E}_s}$ is the estimated amplitude of this signal component; then we find that $$\hat{c} = L_c \cdot \sqrt{\hat{E}_s} \Rightarrow \hat{E}_s = \left(\frac{\hat{c}}{L_c}\right)^2$$

In block 21 the estimated amplitude $\hat{c}$ is used to normalize the systematic bits s'hd i giving:

$$s'_i = \frac{L_c \cdot s_i}{\hat{c}} = \frac{s_i}{\sqrt{\hat{E}_s}}$$

From the log-likelihood ratios $\Lambda_i$ an estimation of the logical bit probabilities can be computed in block 22; the probability of the $i^{th}$ bit being 0 is estimated like $$Pr\{x_i = 0\} = P_i(0) = \frac{1}{1 + e^{-\Lambda_i}}$$

and the probability of that bit being 1 like $$Pr\{x_i = 1\} = P_i(1) = \frac{1}{1 + e^{\Lambda_i}} = 1 - P_i(0)$$

The non-linear relationship between $\Lambda_i$ and logical bit probabilities Pi(0) and Pi(1) can be computed or calculated based on a look-up-table.

These probabilities together with the normalised systematic bits $s'_i$ can be used to compute an estimation $\hat{\sigma}_{n'}^2$ of the variance of the noise in block 23, according to $$\hat{\sigma}_{n'}^2 = \frac{1}{N-1} \sum_{i=0}^{N-1} (s'_i - 1)^2 \cdot P_i(1) + (s'_i + 1)^2 \cdot P_i(0) - K$$

where K is a bias correction computed as follows:

$$K = \frac{1}{N} \sum_{i=0}^{N-1} 2 \cdot (P_i(0) - P_i(1)) \cdot s'_i - 2$$

Then the relation between $\hat{\sigma}_{n'}^2$ and $\hat{E}_s$ and $\hat{N}_0$ is given by $$\hat{\sigma}_{n'}^2 = \frac{\hat{\sigma}_n^2}{\hat{E}_s} = \frac{\hat{N}_0/2}{\hat{E}_s} = \frac{\hat{N}_0}{2\hat{E}_s}$$

When the above equations are rewritten to $$\hat{N}_0 = 2 \cdot \hat{E}_s \cdot \hat{\sigma}_{n'}^2$$

and use $$\hat{c} = L_c \cdot \sqrt{\hat{E}_s} \Rightarrow \sqrt{\hat{E}_s} = \frac{\hat{c}}{L_c}$$

the new estimated optimum scaling factor can be computed in block 24 as:

$$\hat{L}_c = 4 \cdot \frac{\sqrt{\hat{E}_s}}{\hat{N}_0} = \frac{\sqrt{\hat{E}_s}}{2\hat{E}_s \hat{\sigma}_{n'}^2} = \frac{2}{\frac{\hat{c}}{L_c} \hat{\sigma}_{n'}^2} = \frac{2}{\hat{c} \cdot \hat{\sigma}_{n'}^2} \cdot L_c$$

Summarizing, the new scaling factor in the amplitude and variance estimations, and in the current scaling factor can be expressed as follows:

$$\hat{L}_c = \frac{2}{\hat{c} \cdot \hat{\sigma}_{n'}^2} \cdot L_c$$

This calculation is performed using multiplier 25 and memory latch 26, after which the current scaling factor is applied again to the input data y.

Since the turbo decoder 5 is iterative itself, merging it with another iterative algorithm (that of the adaptive scaler 7) requires careful consideration in order to avoid divergence or oscillation. Initialisation of the scaling factor $L_c$ to a reasable starting value proves to be sufficient. In the absence of proper initialisation information, the first decoding iterations can be done with known LogMax or SOVA techniques. These are not scaling factor dependent, and can therefore be used to let the a-posteriori likelihood values converge. Other techniques to acquire initialisation information are filtering over subsequent iterations and coding blocks, and SNR/SIR estimation at the input, see for instance the method described in Summers, T. A., Wilson, S. G., SNR Mismatch and Online Estimation in Turbo Decoding, IEEE Tr. On COM, Vol. 46, No. 4., Apr. 1998, pp. 421-423.

Moreover, divergence can be detected by monitoring the development of the scaling factor $L_c$. Normally, it should converge in a few iterations, and then hardly change. In the case of detected divergence, one can fix the scaling factor $L_c$, or switch to Log-Max or SOVA.

The description of the embodiment above, and set forth in the claims, is based on the LOG-MAP type of turbo decoder. A person skilled in the art will recognize that the ideas of the disclosed method are not restricted to LOG-MAP decoding, but can also be formulated for variations on the LOG-MAP decoding method, and for MAP decoding.

What is claimed is:

1. A method for decoding a convolutionally coded input data signal y comprising:
   multiplying the input data signal with a scaling factor $L_c$;
   demultiplexing the multiplied input data signal $L_c y$ into three signals which are related to systematic bits and parity bits, a demultiplexed input data signal $L_c S$ being associated with the systematic bits;
   turbo decoding the demultiplexed input data signal $L_c S$ in order to obtain turbo decoded output data $\Lambda$,
   characterized in that, the scaling factor $L_c$ is updated for a next iteration in dependence on a combination of a posteriori likelihood data based on turbo decoded output data $\Lambda$ and a priori likelihood data based on the demultiplexed signal $L_c S$, using an estimate of the mean value of the signal amplitude $\hat{c}$ and an estimate of the noise variation $\hat{\sigma}_{n'}^2$
   in which the estimate of the mean value of the signal amplitude is equal to $$\hat{c} = \frac{1}{N} \sum_{i=0}^{N-1} \text{sgn}(\Lambda_i) \cdot L_c \cdot s_i$$

where N is the number of bits in a coding block of the input data signal $s_i$ is the $i^{th}$ systematic bit $\hat{c}$ is the estimation of the mean value of the amplitude of the scaled systematic bits $L_c \cdot s_i$ and $\Lambda$ is the log-likelihood ratio resulting from the most recent turbo decoder iteration,
   and in which the noise variance estimation $\hat{\sigma}_{n'}^2$ equals $$\hat{\sigma}_{n'}^2 = \frac{1}{N-1} \sum_{i=0}^{N-1} (s_i' - 1)^2 \cdot P_i(1) + (s_i' + 1)^2 \cdot P_i(0) - K;$$

the probability of the $i^{th}$ bit being zero is estimated like $$Pr\{x_i = 0\} = P_i(0) = \frac{1}{1 + e^{-\Lambda_i}}$$

and the probability of that bit being one like $$Pr\{x_i = 1\} = P_i(1) = \frac{1}{1 + e^{\Lambda_i}} = 1 - P_i(0);$$

the normalized systematic bits $s_i'$ are calculated as $$s_i' = \frac{L_c \cdot s_i}{\hat{c}};$$

and where K is a bias correction computed as $$K = \frac{1}{N} \sum_{i=0}^{N-1} 2 \cdot (P_i(0) - P_i(1)) \cdot s_i' - 2.$$

2. The method according to claim 1, in which the scaling factor is updated according to $$\hat{L}_c = \frac{2}{\hat{c} \cdot \hat{\sigma}_n^2} \cdot L_c,$$

in which $\hat{L}_c$ is the updated scaling factor.

3. The method according to claim 1, in which the scaling factor $L_c$ is initialized either as a fixed value, as the result of an initial number of iterations using a known algorithm, as the result of filtering over subsequent iterations and coding blocks, or as the result of SNR/SIR estimation of the input data signal y.

4. The method according to claim 1, further comprising calculating the variation of the scaling factor in subsequent iterations and, when the variation after a predetermined number of iterations is above a predetermined threshold value, reverting to a different scaling factor calculation method and/or turbo decoding method.

5. A decoder device for decoding a convolutionally coded input data signal y comprising
   a multiplication element for multiplying a received input data signal y with a scaling factor $L_c$,
   a demultiplexer for demultiplexing the multiplied input data signal $L_c y$ into three signals which are related to systematic bits and parity bits, a demultiplexed input data signal $L_c S$ being associated with the systematic bits;
   a turbo decoder for decoding the demultiplexed input data signal in order to obtain turbo decoded output data $\Lambda$,
   the decoder device (10) further comprises an adaptive scaling element which is arranged to update the scaling factor $L_c$ for a next iteration based on a combination of a posteriori likelihood data based on turbo decoded output data $\Lambda$ and a priori likelihood data based on the demultiplexed signal $L_c S$ using an estimate of the mean value of the signal amplitude $\hat{c}$ and an estimate of the noise variation $\hat{\sigma}_{n'}^2$,
   in which the estimate of the mean value of the signal amplitude is equal to $$\hat{c} = \frac{1}{N} \sum_{i=0}^{N-1} \text{sgn}(\Lambda_i) \cdot L_c \cdot s_i$$

where N is the number of bits in a coding block of the input data signal, $s_i$ is the $i^{th}$ systematic bit, $\hat{c}$ is the estimation of the mean value of the amplitude of the scaled systematic bits $L_c \cdot S_i$ and $\sigma_i$ is the log-likelihood ratio resulting from the most recent turbo decoder iteration
   and in which the noise variance estimation $\hat{\sigma}_{n'}^2$ equals $$\sigma_{n'}^2 = \frac{1}{N-1} \sum_{i=0}^{N-1} (s_i' - 1)^2 \cdot P_i(1) + (s_i' + 1)^2 \cdot P_i(0) - K;$$

the probability of the $i^{th}$ bit being zero is estimated like $$Pr\{x_i = 0\} = P_i(0) = \frac{1}{1 + e^{-\Lambda_i}}$$

and the probability of that bit being one like $$Pr\{x_i = 1\} = P_i(1) = \frac{1}{1+e^{\Lambda_i}} = 1 - P_i(0);$$

the normalized systematic bits $s'_i$ are calculated as $$s'_i = \frac{L_c \cdot s_i}{\hat{c}};$$

and where K is a bias correction computed as $$K = \frac{1}{N}\sum_{i=0}^{N-1} 2 \cdot (P_i(0) - P_i(1)) \cdot s' - 2.$$

6. The decoder device according to claim 5, in which the adaptive scaling element is further arranged to update the scaling factor according to $$\hat{L}_c = \frac{2}{\hat{c} \cdot \hat{\sigma}_{n'}^2} \cdot L_c$$

in which $\hat{L}_c$ is the updated scaling factor.

7. The decoder device according to claim 5, in which the decoder device is further arranged to initialize the scaling factor $L_c$ either as a fixed value, as the result of an initial number of iterations using a known algorithm, as the result of filtering over subsequent iterations and coding blocks, or as the result of SNR/SIR estimation of the input data signal y.

8. The decoder device according to claim 5, in which the decoder device is further arranged to calculate the variation of the scaling factor in subsequent iterations and, when the variation after a predetermined number of iterations is above a predetermined threshold value, reverting to a different scaling factor calculation method and/or turbo decoding method.

* * * * *

UNITED STATES PATENT AND TRADEMARK OFFICE
CERTIFICATE OF CORRECTION

PATENT NO.       : 7,840,884 B2
APPLICATION NO.  : 10/596776
DATED            : November 23, 2010
INVENTOR(S)      : Moelker et al.

It is certified that error appears in the above-identified patent and that said Letters Patent is hereby corrected as shown below:

On the Face Page, in Field (75), under "Inventors", in Column 1, Line 1, delete "Voorhout" and insert -- BN Voorhout --, therefor.

On the Face Page, in Field (75), under "Inventors", in Column 1, Line 1, delete "Winterswijk" and insert -- VW Winterswijk --, therefor.

In Column 1, Line 19, delete "L," and insert -- $L_c$, --, therefor.

In Column 1, Line 20, delete "ly," and insert -- $L_c y$, --, therefor.

In Column 1, Line 22, delete "IS" and insert -- $L_c S$, --, therefor.

In Column 1, Line 37, delete "root-mean square" and insert -- root-mean-square --, therefor.

In Column 2, Line 8, delete "L" and insert -- $L_c$ --, therefor.

In Column 2, Line 11, delete "LS." and insert -- $L_c S$. --, therefor.

In Column 3, Line 11, delete "$L_c$is" and insert -- $L_c$ is --, therefor.

In Column 3, Line 61, after "OF", insert -- THE --, therefor.

In Column 5, Line 24, delete "s'hd i" and insert -- $s'_i$ --, therefor.

In Column 6, Line 44, delete "reasable" and insert -- reasonable --, therefor.

In Column 7, Line 17, in Claim 1, delete "$L_c S$," and insert -- $L_c S$ --, therefor.

In Column 8, Line 40, in Claim 5, delete "$\sigma_{n'}^2$," and insert -- $\sigma_{n'}^2$ --, therefor.

Signed and Sealed this
Twenty-ninth Day of March, 2011

David J. Kappos
*Director of the United States Patent and Trademark Office*

CERTIFICATE OF CORRECTION (continued)
U.S. Pat. No. 7,840,884 B2

In Column 8, Line 52, in Claim 5, delete "$\sigma_i$" and insert -- $\Lambda_i$ --, therefor.